United States Patent
Yuan et al.

(10) Patent No.: US 8,536,697 B2
(45) Date of Patent: Sep. 17, 2013

(54) PACKAGED DIE FOR HEAT DISSIPATION AND METHOD THEREFOR

(75) Inventors: Yuan Yuan, Austin, TX (US); Burton J. Carpenter, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 58 days.

(21) Appl. No.: 13/307,622

(22) Filed: Nov. 30, 2011

(65) Prior Publication Data

US 2013/0134575 A1 May 30, 2013

(51) Int. Cl.
*H01L 23/34* (2006.01)

(52) U.S. Cl.
USPC .................... 257/712; 257/719; 257/E23.104

(58) Field of Classification Search
USPC ..................... 257/712, 719, E23.104
See application file for complete search history.

(56) References Cited

U.S. PATENT DOCUMENTS

| | | | |
|---|---|---|---|
| 4,092,697 A * | 5/1978 | Spaight | 361/718 |
| 6,133,634 A * | 10/2000 | Joshi | 257/738 |
| 7,300,822 B2 | 11/2007 | Li | |
| 7,394,149 B2 | 7/2008 | Clayton et al. | |
| 7,429,788 B2 | 9/2008 | Clayton et al. | |
| 7,520,781 B2 | 4/2009 | Clayton et al. | |
| RE41,559 E * | 8/2010 | Cardwell | 257/706 |
| 7,787,254 B2 | 8/2010 | Clayton et al. | |
| 7,888,786 B2 | 2/2011 | Andry et al. | |
| 7,898,176 B2 | 3/2011 | Li et al. | |
| 7,911,792 B2 | 3/2011 | Liang et al. | |
| 8,012,799 B1 * | 9/2011 | Ibrahim et al. | 438/107 |
| 8,125,782 B2 * | 2/2012 | Azar et al. | 361/709 |
| 2003/0047803 A1 * | 3/2003 | Gektin | 257/719 |
| 2004/0252462 A1 * | 12/2004 | Cromwell et al. | 361/719 |
| 2005/0072555 A1 * | 4/2005 | Sheng-Hsiung | 165/80.3 |
| 2007/0086170 A1 * | 4/2007 | Liang | 361/719 |
| 2011/0057306 A1 | 3/2011 | McShane et al. | |

FOREIGN PATENT DOCUMENTS

| | | |
|---|---|---|
| GB | 2417836 A | 3/2006 |
| GB | 2452880 A | 3/2009 |
| GB | 2453064 A | 3/2009 |
| WO | 2006028643 A2 | 3/2006 |

* cited by examiner

*Primary Examiner* — Lex Malsawma
(74) *Attorney, Agent, or Firm* — James L. Clingan, Jr.; David G. Dolezal

(57) ABSTRACT

A heat spreader die holder that covers at least 50% of both major sides of a semiconductor die. The heat spreader die holder includes at least one opening. The heat spreader die holder is attached to a substrate. Electrically conductive structures of the die are electrically coupled to electrically conductive structures of the substrate.

11 Claims, 4 Drawing Sheets

PACKAGED DIE FOR HEAT DISSIPATION AND METHOD THEREFOR

BACKGROUND

1. Field

This disclosure relates generally to packaged die, and more specifically, to packaged die with heat spreading capability.

2. Related Art

In the semiconductor industry in general, heat dissipation is an issue. Various heat spreading techniques have been used to aid in heat dissipation. High power transistors are particularly sensitive to this concern. The manufacturing of the die itself is tailored to address the issue of heat dissipation. Also the packaging of the die is important. The particular environment of the application can affect the ability to dissipate heat. Thus, one desirable feature is to have the ability to select the particular heat spreader, if one is necessary, to achieve the needed additional heat dissipation. Another important issue is the rate at which heat transfer can occur between the die and the package. Another issue the ability to reduce hot spots within the die.

Accordingly, there is a need to improve upon one or more of the issues discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A die is inserted in an opening of a die holder. The opening is slightly larger than the die so that the die is in close proximity to sides of the of the die holder. The die is held in place by thermal interface material that is either cured or of sufficient viscosity to maintain the position of the die in the opening. The die in this packaged condition is then easily mounted to a surface such as a surface of a printed circuit board (PCB). This is better understood by reference to the FIGs. and the following description. Die holder 10, at least the top portion, should be a heat conductor such as a metal, which may be, for example, copper or aluminum.

Figure 1:
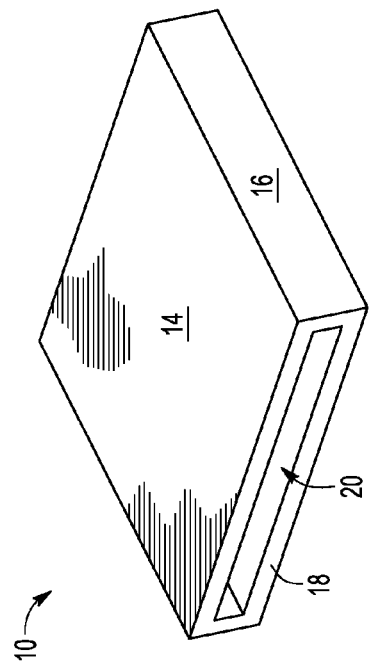
FIG. 1 shows a first view of a die holder according to a first embodiment.

Shown in FIG. 1 is a die holder 10 for use in receiving a semiconductor die. As shown in FIG. 1, die holder 10 has a top side 14, a first side 16, a front side 18, and an opening 20. The opening is sized to have slightly greater width and thickness than the semiconductor intended to be placed in the opening.

Figure 2:
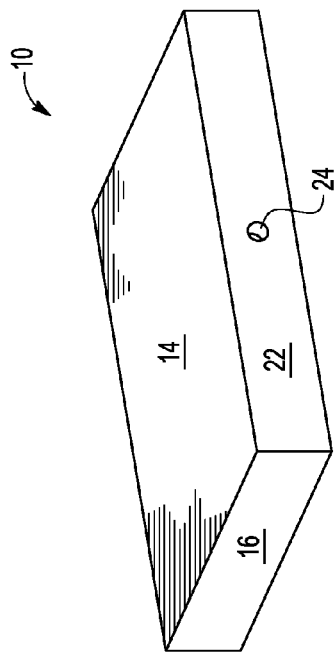
FIG. 2 shows a second view of the die holder of FIG. 1.

Shown in FIG. 2 is die holder 10 showing that die holder 10 has a back side 22 and an opening 24 in back side 22 that extends to opening 20. There is a second side opposite side 16 of which an edge along top side 14 is shown.

Figure 3:
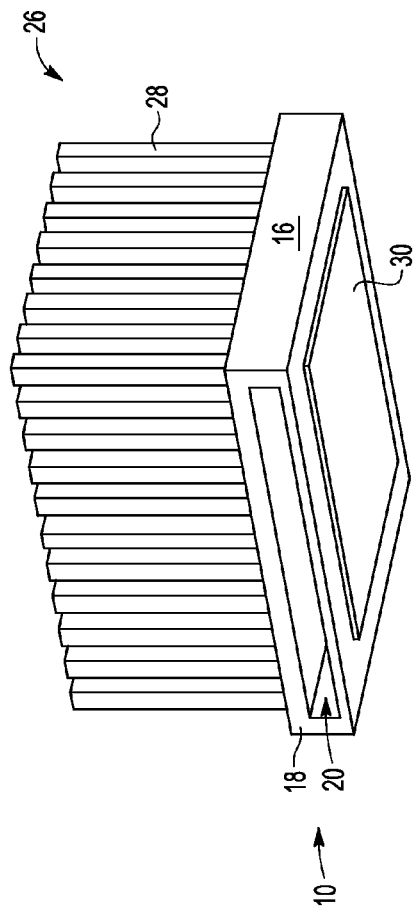
FIG. 3 shows the die holder of FIGS. 1 and 2 with an added heat spreader.

Shown in FIG. 3 is a die holder unit 26 that includes die holder 10 and a heat spreader 28 mounted on top side 14 of die holder 10 and that die holder 10 has a bottom side 30. Instead of attaching heat spreader 28 to top side 14, the top side could be formed with a heat spreader. Top side 14 and bottom side 30 are each considered a major surface of die holder 10. The combination of heat spreader 28 and die holder 10 may be referenced as die holder unit 26. Die holder 10 alone provides some heat spreading so that the expression heat spreader die holder may refer to just the die holder or the combination of the die holder and added heat spreading. The added heat spreading may be a separately added heat spreader or one manufactured as part of the die holder. Because die holder unit 26 includes both a die holder and a heat spreader it may be referenced as a heat spreader die holder.

Figure 4:
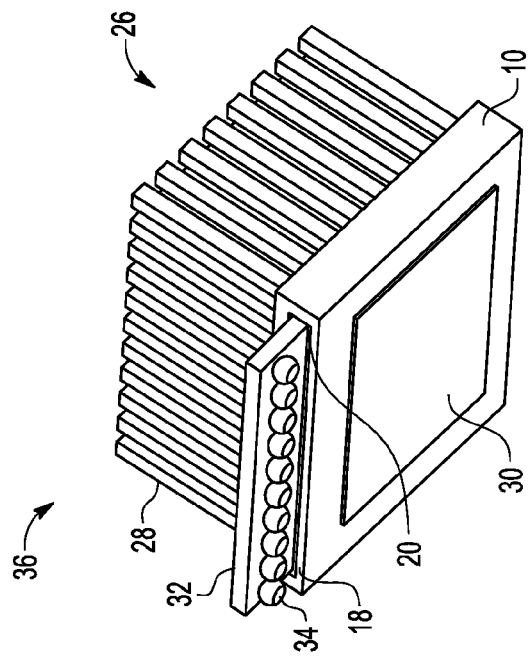
FIG. 4 shows the die holder of FIG. 3 with a die having solder balls.

Shown in FIG. 4 is die holder unit 26 with a semiconductor die 32 in opening 20. Opening 20 is slightly wider and slightly thicker than die 32. Die 32 is inserted fully into opening 20 and is left protruding from opening 20 and exposing a plurality solder balls in a row including a solder ball 34. The combination of die holder unit 26 and die 32 forms die holder assembly 36.

Figure 5:
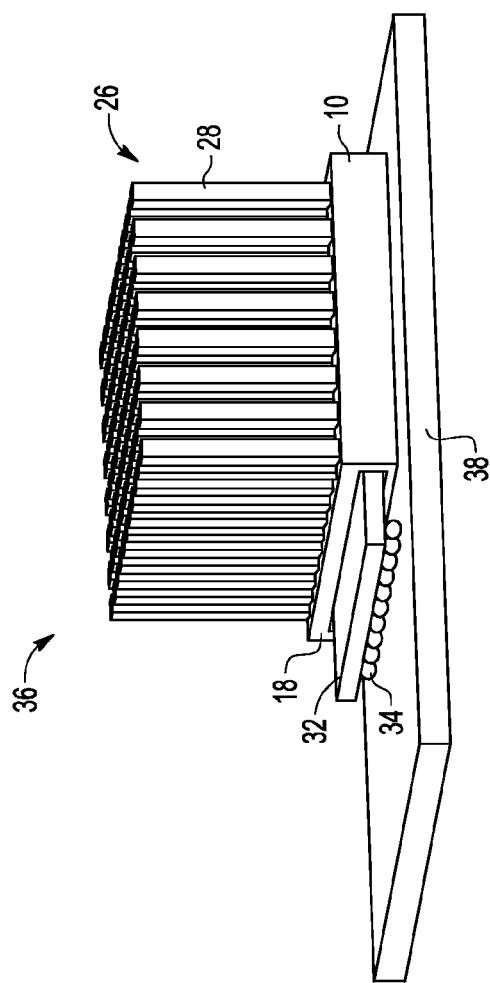
FIG. 5 shows the die holder of FIG. 4 mounted on a printed circuit board.

Shown in FIG. 5 is die holder assembly 36 mounted onto a printed circuit board 38 in which the solder balls, including solder ball 34, are attached to printed circuit board 38. The bottom side of die holder unit 26 is attached to printed circuit board 38 using an attaching material. Examples of an appropriate attaching material are epoxy and solder. This approach allows for a robust method for mounting die 32 to printed circuit board 38 in which there is excellent heat transfer from die 32 to heat spreader 28 through the die holder 10. An alternative to this approach is to extend a top portion of front side 18 over a top side of die 32. This would provide more protection to die 32. Thus the protrusion of die 32 from front side 18 would be on the bottom side of die 32. The sides of die 32 could be covered by extensions along the sides of die holder 10 as well. Printed circuit board 38 could be used just for mounting die holder assemblies or die in addition to die holder assemblies in which case printed circuit board 38 may be considered a package substrate.

Figure 6:
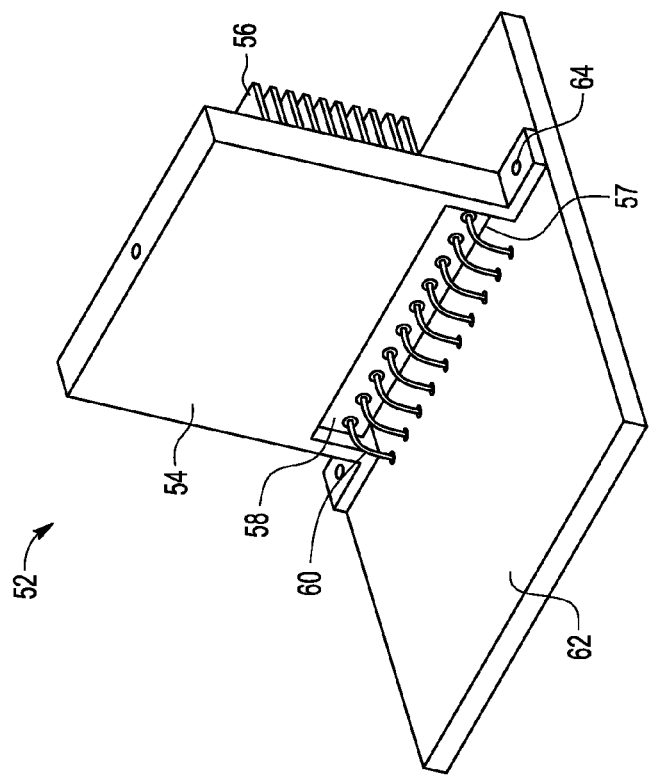
FIG. 6 shows the die holder of FIG. 3 with a die having bond pads mounted on a a printed circuit board.

Shown in FIG. 6 is die holder unit 26 having a die 42 that is wire bonded to a printed circuit board 50. An exemplary wire bonding connection is a bond wire 44 connected to a bond pad 46 on die 42 and connected to a bond pad 48 on printed circuit board 50. This shows a single row of external connections analogous to the row of solder balls shown in FIGS. 4 and 5. In the case of wire bonds, bond pad 46 extends beyond the opening. An alternative is to extend the die holder to encompass die 42 but form an opening to expose the row of bond pads.

Figure 7:
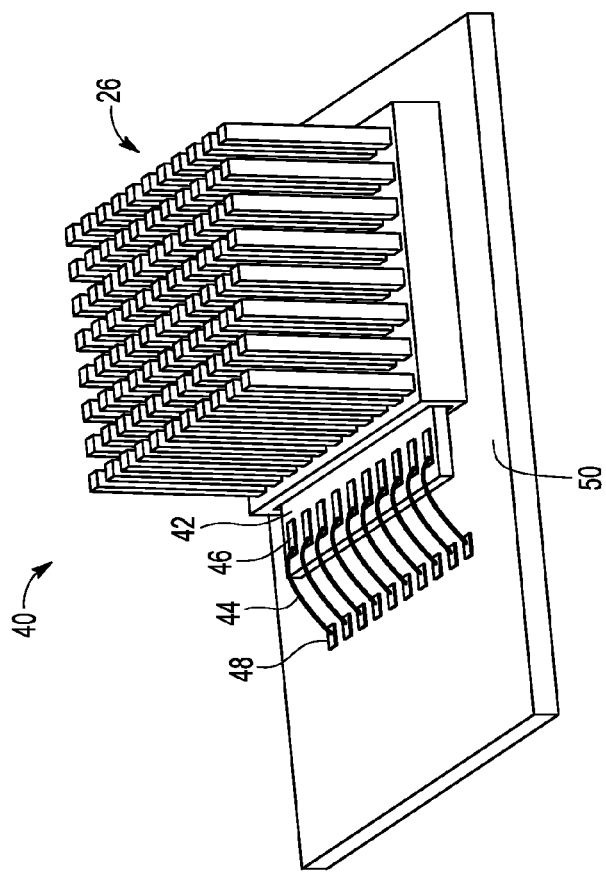
FIG. 7 shows a die holder according to a second embodiment having a die and a heat spreader in which the die holder is mounted on a printed circuit board.

Shown in FIG. 7 is a die holder unit 52 having a die holder 54 and a heat spreader 56 in which an opening 57 is formed in a major surface of die holder 54. A die 58 is wire bonded through opening 57 to a printed circuit board 62. An exemplary wire bond 60 shows an electrical connection between die 58 and printed circuit board 62. A flange 64 extends from adjacent opening 57 to provide a convenient way to attach die holder unit 52 to printed circuit board 62.

Figure 8:
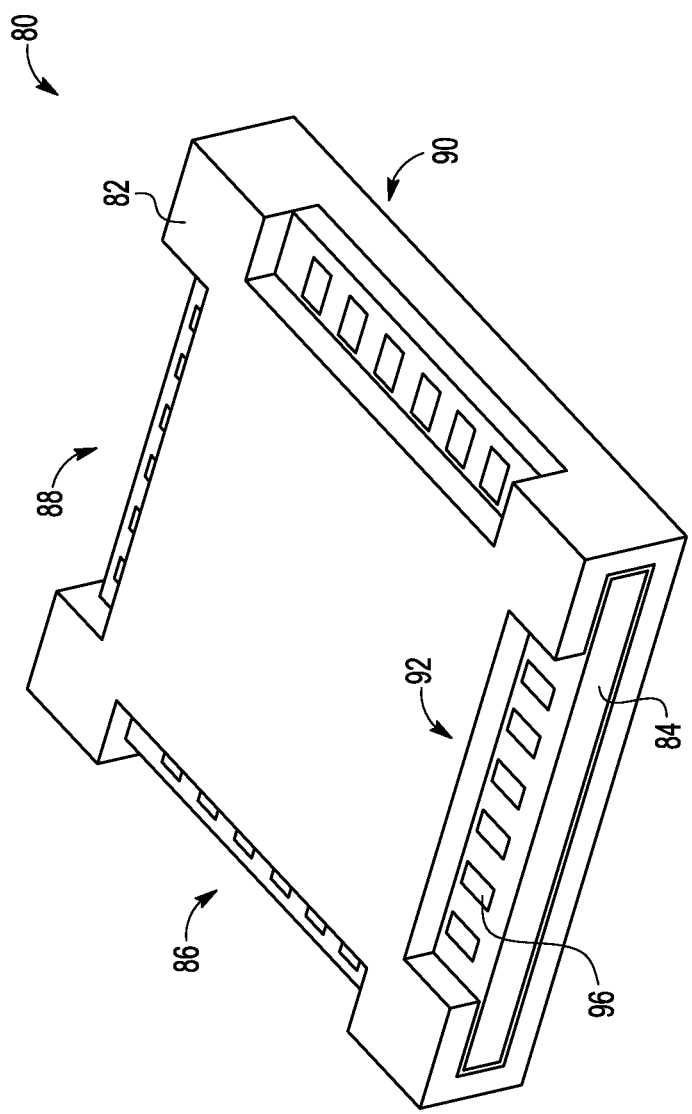
FIG. 8 shows a die holder according to a third embodiment having a die and a heat spreader in which the die holder has openings for connections on four sides.

Shown in FIG. 8 is a die holder assembly 80 that has die holder 82 and a die 84 inserted into an opening 92 of die holder 82. Die holder 82 has an additional opening along each side, openings 86 and 90, and a back side, opening 88, of the top side so that a row of bond pads is exposed at each opening of which bond pad 96 is an exemplary bond pad. With openings along each side exposing bond pads on each side, nearly the whole perimeter of die 84 is available for bond pads that can be attached to a printed circuit board. Analogous to this, the openings can be along the bottom side and solder balls attached to solder pads in those openings. Thus, nearly the entire perimeter is available for attaching to a printed circuit board with solder balls in similar manner to attaching to a printed circuit board with wire bonds as shown for die holder assembly 80. Opening 92 is greater laterally compared to openings 86, 88, and 90 to allow entry of die 84 into die holder 82.

Each major surface preferably has at least 50 percent coverage by the die holder. Preferably the percent should be at least 75 percent. Thus it is shown that a die holder as described above provides a convenient way to connect to a printed circuit board in a manner that provides effective heat dissipation. With the close contact of the die to the die holder, heat is efficiently transferred to the die holder and potentially to bigger heat spreader. The result is an effective way to spread the heat to reduce the magnitude of hot spots on the die and dissipate the heat.

By now it should be appreciated that there has been provided a method of packaging a semiconductor die. The method includes providing a heat spreader die holder, the heat spreader die holder including a first opening. The method further includes inserting a semiconductor die into the heat spreader die holder through the first opening to form a semiconductor die assembly, wherein the semiconductor die includes a plurality of electrically conductive connector structures, wherein for the semiconductor die assembly, at least a majority of a first major side and at least a majority of a second major side of the semiconductor die are covered by thermally conductive structures of the heat spreader die holder. The method further includes physically attaching the semiconductor die assembly to a substrate. The method further includes electrically coupling the plurality of electrically conductive connector structures to a plurality of conductive structures of the substrate. The method may have a further characterization by which for the semiconductor die assembly, at least a portion of the semiconductor die extends out from the first opening, wherein the plurality of electrically conductive connector structures are located on the at least a portion of the semiconductor die. The method may have a further characterization by which the plurality of electrically conductive connector structures are electrically coupled to the plurality of conductive structures of the substrate with a plurality of solder balls. The method may have a further characterization by which the plurality of solder balls are attached to the plurality of electrically conductive connector structures of the semiconductor die prior to inserting the semiconductor die into the heat spreader die holder. The method may have a further characterization by which the electrically coupling the plurality of electrically conductive connector structures to the plurality of conductive structures of the substrate includes wire bonding the plurality of electrically conductive connector structures to the plurality of conductive structures of the substrate. The method may have a further characterization by which wherein the electrically coupling the plurality of electrically conductive connector structures to the plurality of conductive structures of the substrate includes wire bonding the plurality of electrically conductive connector structures to the plurality of conductive structures of the substrate. The method may have a further characterization by which for the semiconductor die assembly, at least 50 percent of each of three minor sides of the semiconductor die are covered by thermally conductive structures of the heat spreader die holder. The method may have a further characterization by which the physically attaching the semiconductor die assembly to a substrate includes attaching the assembly to the substrate such that the first major side of the semiconductor die and the second major side of the semiconductor die are parallel to a major side of the substrate. The method may have a further characterization by which when the semiconductor die assembly is attached to the substrate, the heat spreader die holder includes a thermally conductive structure positioned between the semiconductor die and the substrate. The method may have a further characterization by which wherein the physically attaching the assembly to a substrate includes attaching the assembly to the substrate such that the first major side of the semiconductor die and the second major side of the semiconductor die are perpendicular to a major side of the substrate. The method may have a further characterization by which for the semiconductor die assembly, thermal interface material is located between the semiconductor die and the heat spreader die holder.

Also disclosed is a semiconductor die assembly. The semiconductor die assembly includes a heat spreader die holder. The semiconductor die assembly further includes a semiconductor die at least partially within the heat spreader die holder, wherein at least 50% of a first major side of the semiconductor die and at least 50% of a second major side of the die are covered by thermally conductive material of the heat spreader die holder; wherein the semiconductor die includes plurality of electrically conductive connector structures. The semiconductor die assembly further includes a substrate, the heat spreader die holder attached to the substrate, the substrate including a plurality of electrically conductive structures electrically coupled to the plurality of electrically conductive connector structures, wherein the first major side and the second major side of the semiconductor die are parallel to a major side of the substrate. The semiconductor die assembly may further include a plurality of solder balls, wherein the plurality of electrically conductive connector structures are electrically coupled to the plurality of electrically conductive structures of the substrate with the plurality of solder balls. The semiconductor die assembly may have a further characterization by which the plurality of electrically conductive connector structures are located on the first major side of the semiconductor die, the first major side of the semiconductor die facing the major side of the substrate, the plurality of solder balls are located between the first major side of the semiconductor die and the first major side of the substrate. The semiconductor die assembly may have a further characterization by which the heat spreader die holder includes a major side structure of a thermally conductive material, the major side structure is located between the first major side of the semiconductor die and the first major side of the substrate at a location adjacent to the plurality of solder balls. The semiconductor die assembly may further include a plurality of bond wires, wherein the plurality of electrically conductive connector structures are electrically coupled to the plurality of electrically conductive structures of the substrate with the plurality of bond wires. The semiconductor die assembly may have a further characterization by which the plurality of electrically conductive connector structures are located on the first major side of the semiconductor die, the first major side of the semiconductor die faces away from the major side of the substrate. The semiconductor die assembly may further include thermal interface material located between the semiconductor die and the heat spreader die holder. The semiconductor die assembly may have a further characterization by which the heat spreader die holder includes a major side structure generally parallel to the first major side and the second major side, wherein the major side structure includes an opening at an edge location, the plurality of electrically conductive connector structures are electrically coupled to the plurality of electrically conductive structures of the substrate through the opening. The semiconductor die assembly may have a further characterization by which the heat spreader die holder is characterized as a unitary structure of thermally conductive material.

Disclosed also is a semiconductor die assembly. The semiconductor die assembly includes a heat spreader die holder. The heat spreader die holder further includes a semiconductor die at least partially within the heat spreader die holder, wherein at least 50% of a first major side of the die, at least 50% of a second major side of the die, at least 50% of a first minor side of the semiconductor die, and at least 50% of a second minor side of the semiconductor die are covered by thermally conductive material of the heat spreader die holder, wherein the semiconductor die includes a plurality of electrically conductive connector structures. The semiconductor die assembly further includes a substrate, the heat spreader die holder attached to the substrate, the substrate including a plurality of electrically conductive structures electrically coupled to the plurality of electrically conductive connector structures.

Although the invention is described herein with reference to specific embodiments, various modifications and changes can be made without departing from the scope of the present invention as set forth in the claims below. For example different heat spreaders may be used other than those shown. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor die assembly, comprising:
   a semiconductor die;
   a heat spreader die holder for receiving the semiconductor die through an opening having a greater width and thickness than the semiconductor die;
   wherein:
      the semiconductor die is at least partially within the heat spreader die holder;
      at least 50% of a first major side of the semiconductor die and at least 50% of a second major side of the die are covered by thermally conductive material of the heat spreader die holder;
      the semiconductor die includes an open region having a plurality of electrically conductive connector structures;
      the open region of the semiconductor die is not covered by the thermally conductive material; and
   a substrate, the heat spreader die holder attached to the substrate, the substrate including a plurality of electrically conductive structures electrically coupled to the plurality of electrically conductive connector structures at the open region, wherein the first major side and the second major side of the semiconductor die are parallel to a major side of the substrate.

2. The semiconductor die assembly of claim 1 further comprising:
   a plurality of solder balls, wherein the plurality of electrically conductive connector structures are electrically coupled to the plurality of electrically conductive structures of the substrate with the plurality of solder balls.

3. The semiconductor die assembly of claim 2 wherein the plurality of electrically conductive connector structures are located on the first major side of the semiconductor die, the first major side of the semiconductor die facing the major side of the substrate, the plurality of solder balls are located between the first major side of the semiconductor die and the first major side of the substrate.

4. The semiconductor die assembly of claim 3 wherein the heat spreader die holder includes a major side structure of a thermally conductive material, the major side structure is located between the first major side of the semiconductor die and the first major side of the substrate at a location adjacent to the plurality of solder balls.

5. The semiconductor die assembly of claim 1 further comprising:
   a plurality of bond wires, wherein the plurality of electrically conductive connector structures are electrically coupled to the plurality of electrically conductive structures of the substrate with the plurality of bond wires.

6. The semiconductor die assembly of claim 1 wherein the plurality of electrically conductive connector structures are located on the first major side of the semiconductor die, the first major side of the semiconductor die faces away from the major side of the substrate.

7. The semiconductor die assembly of claim 1 further comprising:
   thermal interface material located between the semiconductor die and the heat spreader die holder.

8. The semiconductor die assembly of claim 1 wherein the heat spreader die holder includes a major side structure generally parallel to the first major side and the second major side, wherein the major side structure includes an opening at an edge location, the plurality of electrically conductive connector structures are electrically coupled to the plurality of electrically conductive structures of the substrate through the opening.

9. The semiconductor die assembly of claim 1 wherein the heat spreader die holder is characterized as a unitary structure of thermally conductive material.

10. A semiconductor die assembly comprising:
   a semiconductor die;
   a heat spreader die holder for receiving the semiconductor die through an opening having a greater width and thickness than the semiconductor die;
   wherein:

the semiconductor die is at least partially within the heat spreader die holder;

at least 50% of a first major side of the die, at least 50% of a second major side of the die, at least 50% of a first minor side of the semiconductor die, and at least 50% of a second minor side of the semiconductor die are covered by thermally conductive material of the heat spreader die holder;

the semiconductor die includes a plurality of electrically conductive connector structures in an open region of the semiconductor die not covered by the thermally conductive material; and a substrate, the heat spreader die holder attached to the substrate, the substrate including a plurality of electrically conductive structures electrically coupled to the plurality of electrically conductive connector structures at the open region.

11. A semiconductor die assembly, comprising:

a heat spreader die holder;

a semiconductor die at least partially within the heat spreader die holder, wherein at least 50% of a first major side of the semiconductor die and at least 50% of a second major side of the die are covered by thermally conductive material of the heat spreader die holder; wherein the semiconductor die includes plurality of electrically conductive connector structures; and a substrate, the heat spreader die holder attached to the substrate, the substrate including a plurality of electrically conductive structures electrically coupled to the plurality of electrically conductive connector structures, wherein the first major side and the second major side of the semiconductor die are parallel to a major side of the substrate;

wherein the heat spreader die holder includes a major side structure generally parallel to the first major side and the second major side, wherein the major side structure includes an opening at an edge location, the plurality of electrically conductive connector structures are electrically coupled to the plurality of electrically conductive structures of the substrate through the opening.

* * * * *